(12) United States Patent
Luo et al.

(10) Patent No.: US 11,733,892 B2
(45) Date of Patent: Aug. 22, 2023

(54) PARTIAL SUPERBLOCK MEMORY MANAGEMENT

(71) Applicant: Micron Technology, Inc., Boise, ID (US)

(72) Inventors: Xiangang Luo, Fremont, CA (US); Ashutosh Malshe, Fremont, CA (US); Huachen Li, San Jose, CA (US); Giuseppe D'eliseo, Caserta (IT); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/362,542

(22) Filed: Jun. 29, 2021

(65) Prior Publication Data

US 2022/0413699 A1 Dec. 29, 2022

(51) Int. Cl.
*G06F 3/06* (2006.01)

(52) U.S. Cl.
CPC ............ *G06F 3/064* (2013.01); *G06F 3/0604* (2013.01); *G06F 3/0679* (2013.01)

(58) Field of Classification Search
USPC ........................................................ 711/154
See application file for complete search history.

(56) References Cited

U.S. PATENT DOCUMENTS

| 10,365,996 | B2 * | 7/2019 | Gupta | G06F 12/02 |
| 10,635,324 | B1 * | 4/2020 | Klein | G06F 3/0679 |
| 2009/0327591 | A1 * | 12/2009 | Moshayedi | G06F 3/0659 |
| | | | | 711/E12.001 |
| 2014/0231954 | A1 | 8/2014 | Lue | |
| 2016/0170919 | A1 * | 6/2016 | Blagodurov | G06F 11/3452 |
| | | | | 711/154 |
| 2016/0179386 | A1 | 6/2016 | Zhang | |
| 2018/0336960 | A1 * | 11/2018 | Chu | G06F 11/3034 |
| 2020/0034080 | A1 * | 1/2020 | Chen | G06F 3/064 |

(Continued)

FOREIGN PATENT DOCUMENTS

| CN | 112612722 A * | 4/2021 | ......... G06F 12/0246 |
| WO | 2017074570 A1 | 5/2017 | |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Sanjiv Shah
*Assistant Examiner* — Elias Young Kim
(74) *Attorney, Agent, or Firm* — Brooks, Cameron & Huebsch, PLLC

(57) ABSTRACT

An apparatus can include a partial superblock memory management component. The partial superblock memory management component can identify bad blocks in respective planes of a block of non-volatile memory cells. The partial superblock memory management component can determine that a plane of the respective planes includes at least good block in at least one different block of non-volatile memory cells. The partial superblock memory management component can perform an operation to reallocate the at least one good block in the plane to the at least one bad block in the plane to form blocks of non-volatile memory cells having a quantity of bad blocks that satisfies a bad block threshold.

20 Claims, 6 Drawing Sheets

(56) References Cited

U.S. PATENT DOCUMENTS

| | | | | |
|---|---|---|---|---|
| 2020/0034223 A1* | 1/2020 | Rori | .................. | G06F 11/073 |
| 2020/0192796 A1* | 6/2020 | Lee | .................. | G11C 29/886 |
| 2020/0401328 A1* | 12/2020 | Lee | .................. | G06F 3/0679 |
| 2021/0334173 A1* | 10/2021 | Hwang | .................. | G06F 3/0683 |
| 2022/0179724 A1* | 6/2022 | Shim | .................. | G06N 20/00 |

* cited by examiner

PARTIAL SUPERBLOCK MEMORY MANAGEMENT

TECHNICAL FIELD

Embodiments of the disclosure relate generally to memory sub-systems, and more specifically, relate to partial superblock memory management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
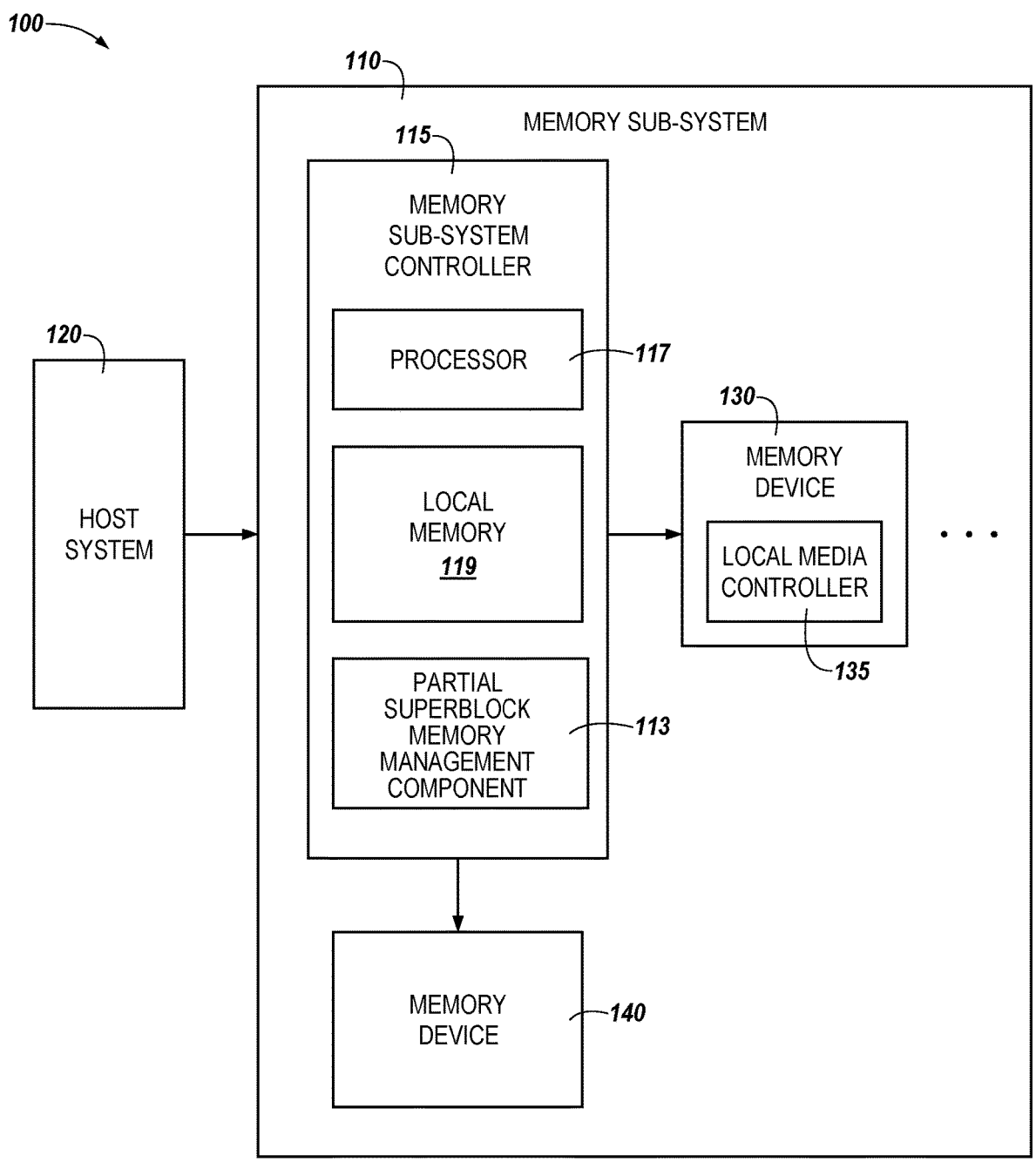
FIG. 1 illustrates an example computing system that includes a memory sub-system in accordance with some embodiments of the present disclosure.

Aspects of the present disclosure are directed to partial superblock memory management, in particular to memory sub-systems that include a partial superblock memory management component. A memory sub-system can be a storage device, a memory module, or a hybrid of a storage device and memory module. An example of a memory sub-system is a storage system, such as a solid state drive (SDD). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Performance of a NAND can be determined by the program speed of the NAND. That is, the speed at which it takes to program the pages of a NAND. Systems can improve performance by grouping multiple NAND pages together in order to program the NAND pages concurrently. For instance, superblocks can be formed to increase system performance. A superblock, as used herein, can refer to a set of blocks that span multiple die that are written in an interleaved fashion. In some cases, a superblock may span all the die within an SSD. A superblock may contain multiple blocks from a single die. A superblock may be a unit of management within the SSD.

Traditionally, superblocks include a block from every plane in every die of a NAND. However, due to non-uniformity and variation in a manufacturing process, a NAND can initially include a small percentage of bad blocks. In addition, good blocks (i.e., blocks that are not classified as a bad block and that can initially reliably store data) can become bad blocks as blocks wear out during an operational lifetime of the NAND.

As used herein, a bad block refers to an area of storage media that is no longer reliable for storing and retrieving data because it has been physically damaged or corrupted. Bad blocks are also referred to as bad sectors. Conversely, as used herein a good block refers to a block that is functional and can be used to stored data. When a block in a plane of any die becomes a bad block, a traditional superblock (i.e., a full superblock) is not formed. This inherently reduces the number of superblocks that can be formed and thereby reduces performance of a NAND array.

To address this problem, partial superblocks can be used. A partial superblock removes a plane across die (e.g., the partial superblock is less one or more planes than a full superblock) when that plane has a bad block. Use of partial superblocks (e.g., having at least one bad block) provides benefits to NAND devices in a number of ways. For example, with partial superblocks, as long as other planes have fewer failures, dies can be treated as good. Having fewer good blocks per plane for an acceptable die results in the need for fewer redundant blocks or planes being designed into the NAND. Thus, fewer total block counts and smaller die sizes reduce the cost per die of NAND. This effect also results in higher manufacturing yields as a single plane failure will not result in a die failure.

However, use of partial superblocks can provide a decrease in performance as compared to performance realized with a traditional full superblock. An amount of performance decrease in a partial superblock can be a function of a quantity of bad blocks in the partial superblock. Greater quantities of bad blocks can lead to greater decreases in performance. For example, an individual bad block in a partial superblock can lead to a ~12.5% decrease in performance of the partial superblock, while a two bad blocks in the partial superblock can lead to a 25% decrease. Greater decreases in performance can become perceptible by an end-user and/or can interfere with an operation of a memory device.

As such, some approaches attempt to reallocate blocks to reduce a quantity of partial superblocks. While this can reduce a quantity of partial superblocks it can also condense the bad blocks into the remaining partial superblock and thereby exacerbate a decrease in performance of the remaining partial superblocks. Further, in some other approaches, partial superblocks are not used (e.g., not used for data storage). However, not using these partial superblocks can also decrease system performance. The degraded performance from condensing bad blocks in partial superblocks and/or not using partial superblocks can be undesirable, especially in critical applications and/or in applications in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies by performing partial superblock memory management. For instance, partial superblock memory management can include performing an operation to reallocate a good block in a plane to replace a bad block in the plane and thereby form partial superblocks having a quantity of bad blocks that satisfy (e.g., is less than or equal to) a bad block threshold.

As used herein, reallocating a block can refer to reallocating a logical block, a physical block, or both. As used herein, the terms "physical block" and "logical block" generally refer to various characterizations of memory blocks that can be categorized by a physical location where such memory blocks are stored within a memory sub-system or a logical location in which addresses corresponding to the physical location(s) where such memory blocks are stored within the memory sub-system. For example, a "physical block" generally refers to a set of memory cells that store charges corresponding to data values. A physical block has an address (e.g., a physical block address) associated therewith. A "logical block" generally refers to a data structure that contains logical address information (e.g., a logical block address) corresponding to the physical addresses of memory locations within a physical block. Reallocating can include updating a mapping entry (e.g., an address or data indicative of an address, among other possible information) in a data structure (e.g., a table) such as a Physical to Logical (P2L) table and/or a Logical to Physical (L2P) table.

Figure 2A:
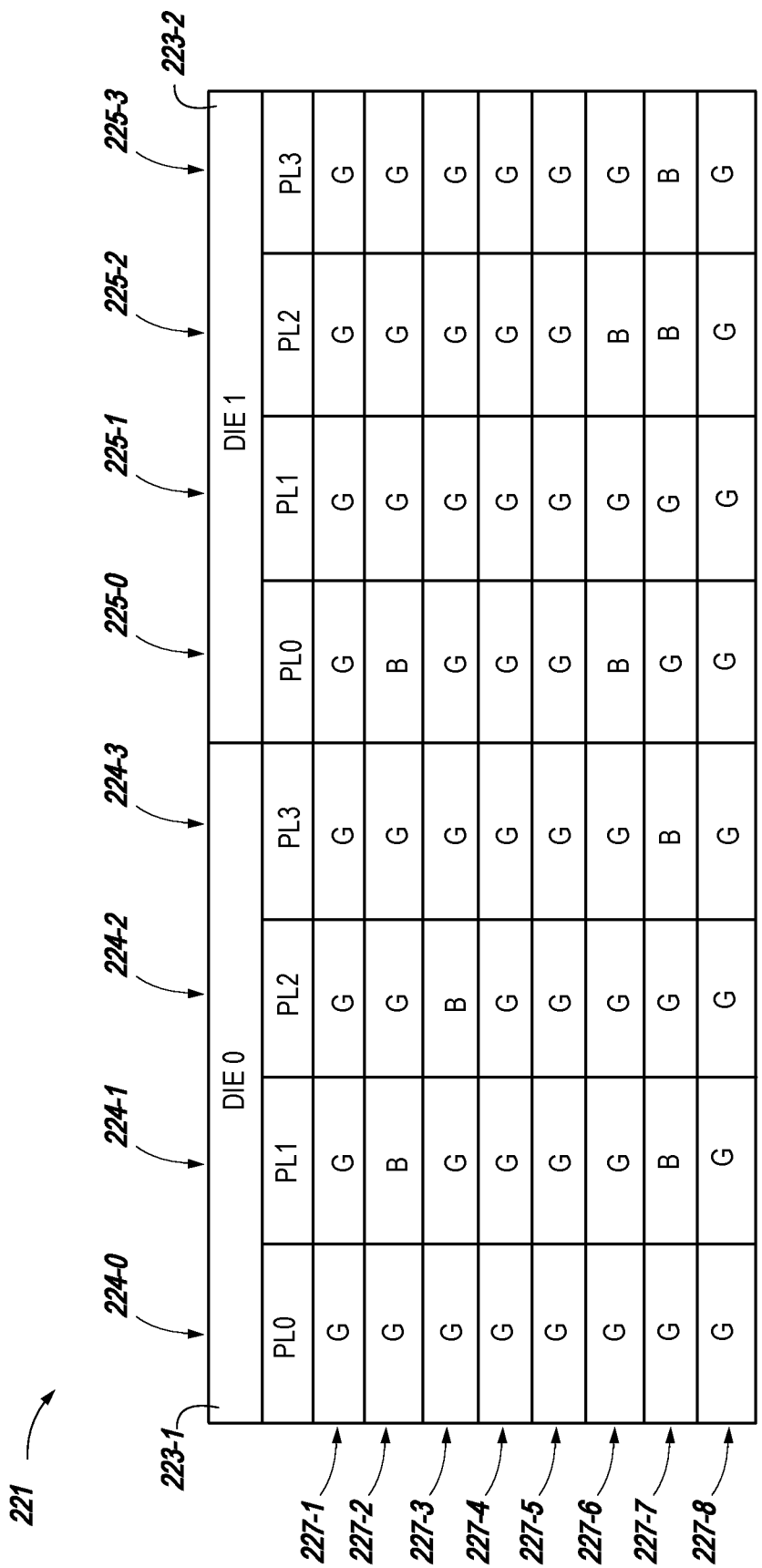
FIG. 2A illustrates an example of a non-volatile memory array in accordance with some embodiments of the present disclosure.
Figure 2B:
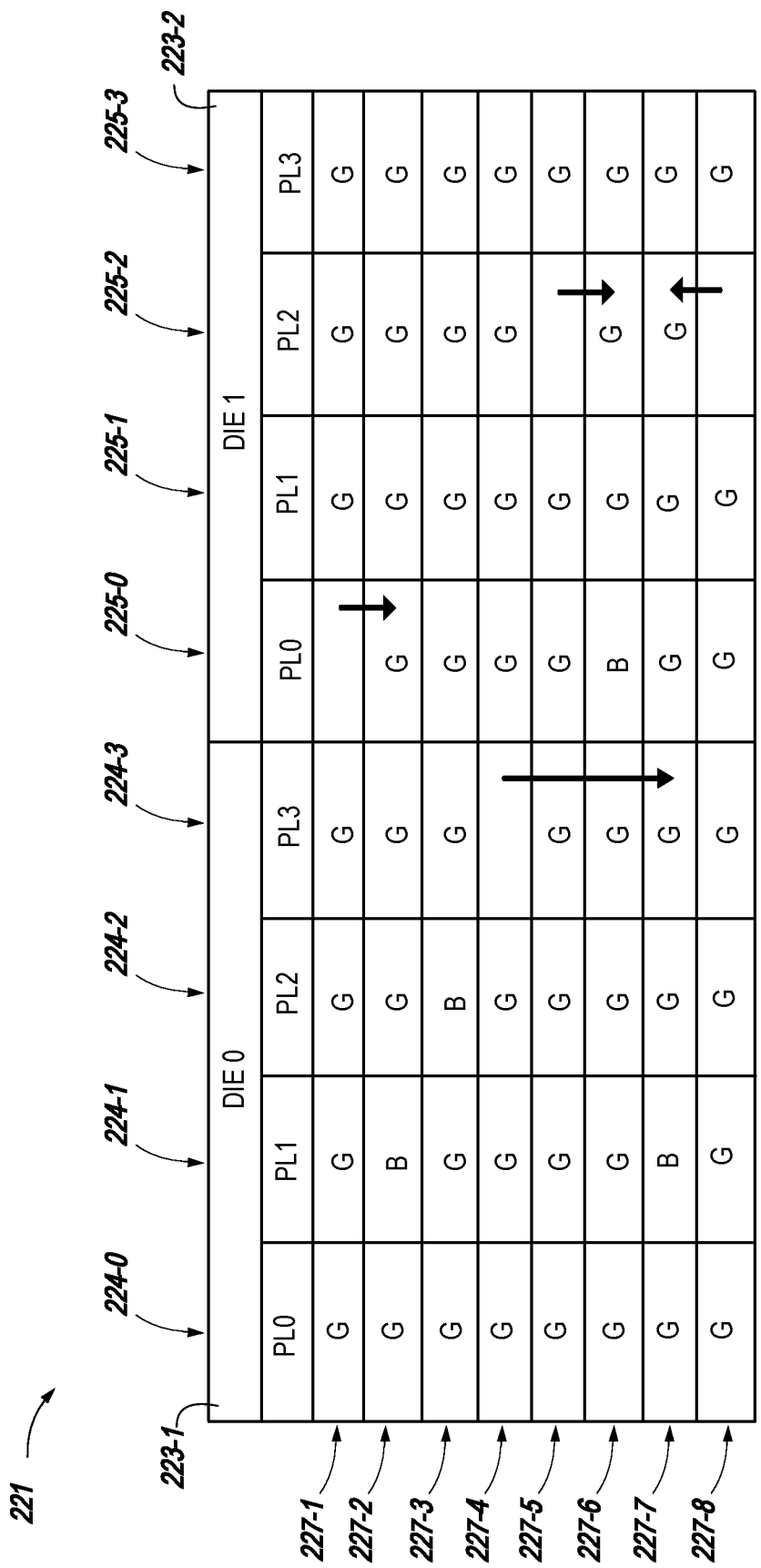
FIG. 2B illustrates another example of a non-volatile memory array in accordance with some embodiments of the present disclosure.

Accordingly, as detailed in FIG. 2A and FIG. 2B, reallocating blocks can form partial superblocks having a quantity of bad blocks that satisfy (e.g., is less than or equal to) a bad block threshold such as a bad block threshold that is equal to one bad block. Forming partial superblocks having a quantity of bad blocks that satisfy a bad block threshold can, in contrast to other approaches that seek to decrease a quantity of partial superblocks, instead increase a quantity of partial superblocks, as detailed herein with respect to FIG. 2A and FIG. 2B. Increasing the quantity of partial superblocks can permit use of the partial superblocks, and yet can ensure any performance decrease associated with a particular partial superblock is limited to an amount (e.g., an amount proportional to an individual bad block in the partial superblock) that will not be perceptible to an end user and/or significantly impact memory system performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage memory, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a partial superblock memory management component 113. Although not shown in FIG. 1 so as to not obfuscate the drawings, the partial superblock memory management component 113 can include various circuitry to facilitate identifying a plurality of bad blocks in respective planes of a block of NAND memory cells, determining that a plane of the respective planes includes at least one good block in at least one different block of NAND memory cells, and performing an operation to reallocate the at least one good block in the plane to the at least one bad block in the plane to form a plurality of blocks of NAND memory cells having a quantity of bad blocks that is less than or equal to a bad block threshold. In some embodiments, the partial superblock memory management component 113 can include special purpose circuitry in the form of an ASIC, FPGA, state machine, and/or other logic circuitry or software and/or firmware that can allow the partial superblock memory management component 113 to orchestrate and/or perform partial superblock memory management for the memory device 130 and/or the memory device 140.

In some embodiments, the memory sub-system controller 115 includes at least a portion of the partial superblock memory management component 113. For example, the memory sub-system controller 115 can include a processor 117 (processing device) configured to execute instructions stored in local memory 119 for performing the operations described herein. In some embodiments, the partial superblock memory management component 113 is part of the host system 110 (not illustrated), an application, or an operating system.

In a non-limiting example, an apparatus (e.g., the computing system 100) can include a partial superblock memory management component 113. The partial superblock memory management component 113 can be resident on the memory sub-system 110. As used herein, the term "resident on" refers to something that is physically located on a particular component. For example, the partial superblock memory management component 113 being "resident on" the memory sub-system 110 refers to a condition in which the hardware circuitry that comprises the partial superblock memory management component 113 is physically located on the memory sub-system 110. The term "resident on" can be used interchangeably with other terms such as "deployed on" or "located on," as referred to herein.

The partial superblock memory management component 113 can be configured to identifying a quantity of bad blocks in a block of NAND memory cells. For instance, the partial superblock memory management component 113 can identify bad blocks in respective planes of a block of NAND memory cells in a plurality of blocks of NAND memory cells. In some embodiments, the plurality of blocks of NAND memory cells can be superblocks. As mentioned, a superblock generally refers to a set of data blocks that span multiple memory dices that are written in interleaved fashion. As used herein, the terms "block," "block of memory cells," and/or "interleaved NAND memory blocks," as well as variants thereof, can, given the context of the disclosure, be used interchangeably.

In some embodiments, the partial superblock memory management component 113 can determine that a plane of the respective planes having at least one bad block includes at least one good block. For instance, the superblock memory management component 113 can determine that a plane of the respective planes includes at least one good block in at least one block of NAND memory cells that is different than the bad block. Determining the plane has at least one good block can permit reallocation of the at least one good block.

For instance, in some embodiments, the partial superblock memory management component 113 can perform an operation to reallocate at least one good block in the plane to at least one bad block in the plane. Such reallocation can desirably form a blocks of NAND memory cells having a quantity of bad blocks that satisfy (e.g., is less than or equal to) a bad block threshold. As mentioned, forming blocks of NAND memory cells that having a quantity of bad blocks that satisfies the bad block threshold can ensure any performance decrease is limited (e.g., limited to an amount proportional to an individual bad block in the partial superblock that will not be perceptible to an end user/significantly impact memory system performance), and yet can permit use of the partial superblocks in contrast to other approaches which do not employ partial superblock memory management.

FIG. 2A illustrates an example of a non-volatile memory array 221 in accordance with some embodiments of the present disclosure. In some embodiments, the non-volatile memory array 221 can be a NAND memory array. In some embodiments, the non-volatile memory array 221 can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The non-volatile memory array 221 can include a number of dies ("DIE 0") 223-1 and ("DIE 1") 223-2 (hereinafter referred to as a number of dies 223). While illustrated as including two dies 223-1 and 223-2, the number of dies can be increased or decreased. For instance, a number of dies 223 can be equal to two dies, three dies, or four dies, among other possible number of dies.

In some embodiments, a bad block threshold can be based on a number of dies 223 and/or be based on a permissible amount of latency. For instance, the bad block threshold can be based on a number of dies 223 in the memory device. In some embodiments, the bad block threshold can be proportional to a number of dies in the memory device. For example, a bad block threshold can be higher (e.g., can include a greater quantity of bad blocks) for a greater number of dies.

In some embodiments, the bad block threshold can be based on a permissible amount of latency. An amount of latency or performance decrease can be equal to or based on a quantity of bad blocks divided by a quantity of planes in a block of NAND memory cells (e.g., in a superblock). For instance, having an individual bad block in a block of NAND memory cells can lead to a ⅛ decrease in performance (i.e., ~12.5 percent increase in latency) in the non-volatile memory array 221 with two dies which each have four respective planes as illustrated in FIG. 2A and FIG. 2B. Similarly, having two bad blocks in the block of NAND memory cells can lead to ⅖ decrease in performance (i.e., a 25% increase in latency) in the non-volatile memory array 221. In such examples, the bad block threshold can be a quantity of bad blocks having a corresponding increase in latency that is less than or equal to a permissible amount of latency. For instance, if a permissible amount of latency is 20% then the bad block threshold can be set to one bad block (e.g., having 12.5 percent latency) for a given block of NAND memory cells (e.g., superblock).

However, other values of the bad block threshold are possible. For example, as a quantity of dies in non-volatile memory array 221 increase and/or as a permissible amount of latency increases the bad block threshold can increase. In some embodiments the bad block threshold can be equal to four or fewer bad blocks in a block of NAND memory. For instance, the bad block threshold can be equal to four bad blocks. In some embodiments, the bad block threshold can be equal to three or fewer bad blocks in a block of NAND memory. For instance, the bad block threshold can be equal to three bad blocks. In some embodiments, the bad block threshold can be equal to two or fewer bad blocks in a block of NAND memory. For instance, the bad block threshold can be equal to two bad blocks. Yet other values of the bad block threshold such as five bad blocks, six bad blocks, etc. are possible.

The number of dies 223 can include a number of planes including a first plane 224-0, a second plane 224-1, a third plane 224-2, and a fourth plane 224-3 (collectively referred to herein as "planes 224") (e.g., "PL0", "PL1", "PL2" to "PL3" of "DIE 0" 223-1) and a first plane 225-0, a second plane 225-1, a third plane 225-2, and a fourth plane 225-3 (collectively referred to herein as "planes 225") (e.g., "PL0", "PL1", "PL2", to "PL3" of "DIE1" 223-2). The number of dies 223 and the planes 224, 225 can include a quantity of blocks of NAND memory cells (i.e., superblocks) 227-1, 227-2, 227-3, 227-4, 227-5, 227-6, 227-7 to 227-8 (hereinafter referred to collectively as superblocks 227). Each of the blocks of the superblocks 227 can be referred to as a good block as represented by ("G") or a bad block as represented by ("B").

A full superblock can refer to a superblock that includes a particular number of good blocks. For example, a first superblock 227-1 can be a full superblock that includes all good blocks (e.g., all blocks designated as "G") across the planes of both die 223-1 and die 223-2. Likewise, a fourth 227-4 superblock, a fifth 227-5 superblock, and an eighth 227-8 superblock are full superblocks. These full superblocks can be referred to as having 100% performance or, put another way, performance that is not affected by a bad block.

As mentioned, a partial superblock can refer to a superblock with at least one bad block. For example, a second superblock 227-2 includes a first bad block (e.g., "B") in a second plane 224-1 of a first die 223-1 and a second bad block in a first plane 225-0 of the second die 223-2. Thus, the second superblock 227-2 may see a ~25% reduction in performance when compared to a full superblock. Similarly, a sixth superblock 227-6 includes two bad blocks and may see a ~25% reduction in performance, while a seventh superblock 227-7 includes three bad blocks and may see a ~37.5% reduction in performance.

In prior approaches referred to above, the second superblock 227-2, sixth superblock 227-6, and seventh superblock 227-7 may have been discarded or ignored when processing data in the non-volatile memory array 221. However, as mentioned, not writing data to such superblocks can degrade memory performance for instance by failing to utilize good blocks in the second superblock 227-2, sixth superblock 227-6, and seventh superblock 227-7. Moreover, in other prior approaches some/all of the blocks in the second superblock 227-2, the sixth superblock 227-6 and/or the seventh superblock 227-7 could be relocated to different superblocks and thereby decrease a quantity of partial superblocks. However, as mentioned, reducing a quantity of partial superblocks can condense bad blocks into the remaining partial superblock and thereby exacerbate a decrease in performance of the remaining partial superblocks.

In contrast to such approaches, partial superblock memory management can increase a quantity of partial superblocks. Increasing the quantity of partial superblocks can permit use of the partial superblocks, and yet can ensure any performance decrease associated with a particular partial superblock is limited to an amount (e.g., an amount proportional to an individual bad block in the partial superblock) that will not be perceptible to an end user and/or significantly impact memory system performance. For instance, as described in FIG. 2B blocks can be reallocated to form blocks of NAND memory cells (partial superblocks) having a quantity of bad blocks that satisfies (e.g., is less than or equal to) a bad block threshold.

FIG. 2B illustrates another example of a non-volatile memory array 221 in accordance with some embodiments of the present disclosure. The non-volatile memory array 221 illustrates an example of block reallocation consistent with partial superblock memory management. As illustrated in FIG. 2B, one or more blocks from blocks of NAND memory cells (e.g., full superblocks) can be reallocated to different blocks of NAND memory cells (e.g., partial superblocks). Allocating a block from a block of NAND memory cells (e.g., from a full superblock) to different blocks of NAND memory cells (e.g., to a partial superblock) can occurr in the absence of reallocating a good block from any partial superblock. Reallocating good blocks, for instance from a full superblock to a partial superblock, in the absence of reallocating a good block from any partial superblock can ensure a total number of partial superblocks is increased and thereby ensure that any bad blocks are evenly distributed among the resultant partial superblocks which each have a quantity of bad blocks that satisfies a bad block threshold.

For instance, the fourth superblock 227-4 includes a first good block in a fourth plane 224-3 of a first die 223-1. The first good block of the fourth superblock can be reallocated to a bad block in the same die (the first die 223-1) and same plane (the fourth plane 224-3). For instance, the first good block in a fourth plane 224-3 can be reallocated to a first bad block in the first die 223-1 and fourth plane 224-3 of the seventh superblock 227-7.

Similarly, a second good block in the first plane 225-0 of the second die 223-2 of the first superblock 227-1 can be reallocated to a second bad block in the first plane 225-0 of the second die 223-2 of the second superblock 227-2, a third good block in the third plane 225-2 of the second die 223-2 of the fifth superblock 227-5 can be reallocated to a third bad block in the third plane 225-2 of the second die 223-2 of the sixth superblock 227-6, and a fourth good block in the third plane 225-2 of the second die 223-2 of the eighth superblock 227-8 can be reallocated to a fourth bad block in the third plane 225-2 of the second die 223-2 of the seventh superblock 227-7. As mentioned, reallocating can include updating a mapping entry in a data structure such as a Physical to Logical (P2L) table and/or a Logical to Physical (L2P) table. For example, a logical block and/or physical block (e.g., a good block) can be reallocated by updating a mapping entry in a table of a physical and/or logical mapping (from a different physical and/or logical block such as a physical and/or logical block associated with a bad block) to the physical and/or logical block associated with the good block.

As mentioned, forming partial superblocks having a quantity of bad blocks that satisfy a bad block threshold can, in contrast to other approaches that seek to decrease a quantity of partial superblocks, increase a quantity of partial superblocks, as illustrated in FIG. 2A and FIG. 2B. For instance, each of the superblocks 227-1 to 227-8 can be a partial superblock having the same quantity of bad blocks (e.g., one bad block) that satisfies a bad block threshold (e.g., one bad block). That is, FIG. 2A includes four partial superblocks 227-2, 227-3, 227-6, and 227-7, while FIG. 2B includes 8 partial superblocks 227-1 to 227-8. As mentioned, increasing the quantity of partial superblocks can permit use of the partial superblocks, and yet can ensure any performance decrease associated with a particular partial superblock is limited to an amount (e.g., an amount proportional to an individual bad block in the partial superblock) that will not be perceptible to an end user/significantly impact memory system performance.

Figure 3:
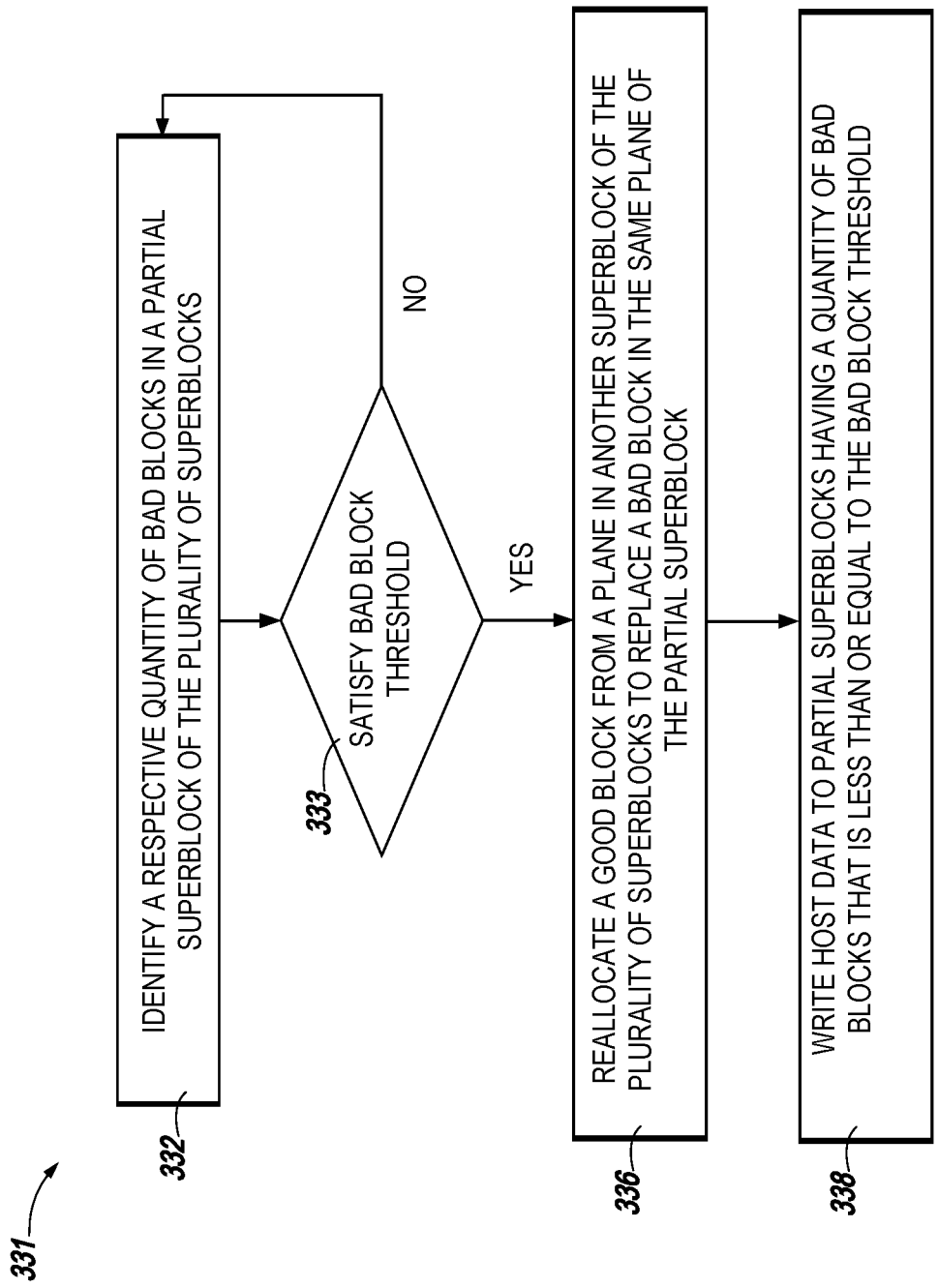
FIG. 3 illustrates an example flow diagram of partial superblock memory management in accordance with some embodiments of the present disclosure.

FIG. 3 illustrates an example flow diagram 331 of partial superblock memory management in accordance with some embodiments of the present disclosure. At operation 332, a partial superblock memory management component (such as partial superblock memory management 113 in FIG. 1) can identify a respective quantity of bad blocks in a partial superblock. For instance, bad blocks (and similarly good blocks) can be determined based on a block pool or other type of information corresponding to the locations (e.g., plane, die, superblock, etc.) of the blocks in a non-volatile memory array. In some instances, whether a block is a good block or a bad block can be determined based the block satisfying a failure conduction. For instance, it can be determined that a read, a write, or both to a given block fails. In which case, the block can be deemed to satisfy a failure conduction and can then be designated as a bad block (e.g., designated as a bad block in a block pool). Examples are not so limited, however, and in some embodiments, a block can be designated as a bad block based on a quantity of program-erase cycles experienced by the block, a raw bit error rate associated with the block, etc. Conversely, a read, a write, or both to a given block may be successful (e.g., successfully store data at and/or read data from the block) and the block can then be designated as a good block.

At operation 333, the partial superblock memory management component can determine whether the respective quantity of bad blocks satisfies a bad block threshold. For instance, a determination can be made whether the respective quantity of bad blocks is less than or equal to the bad block threshold. The bad block threshold can be fixed or variable. In some embodiments, the bad block threshold can be variable and can be adjusted based on a number of parameters at different stages of usage of a memory device.

Responsive to a determination that the respective quantity of bad blocks satisfies a bad block threshold, the flow diagram 331 can proceed to operation 336. However, responsive a determination that the respective quantity of bad blocks does not satisfy (e.g., is greater than) a bad block threshold, the flow diagram 331 can return to 332 and a quantity of bad blocks in a different superblock (e.g., a different partial superblock) can be determined.

At operation 336, an operation can be performed to reallocate a good block from a plane in another superblock of the plurality of superblocks to replace a bad block in the same plane of the partial superblock to form a number of partial superblocks each having quantify of bad blocks that is less than or equal to the bad block threshold. For instance, the operation can be performed responsive to a determination, at operation 333, that the quantify of bad blocks satisfies the bad block threshold. At operation 338, host data can be written to partial superblocks having the quantity of bad blocks that is satisfies the bad block threshold.

Figure 4:
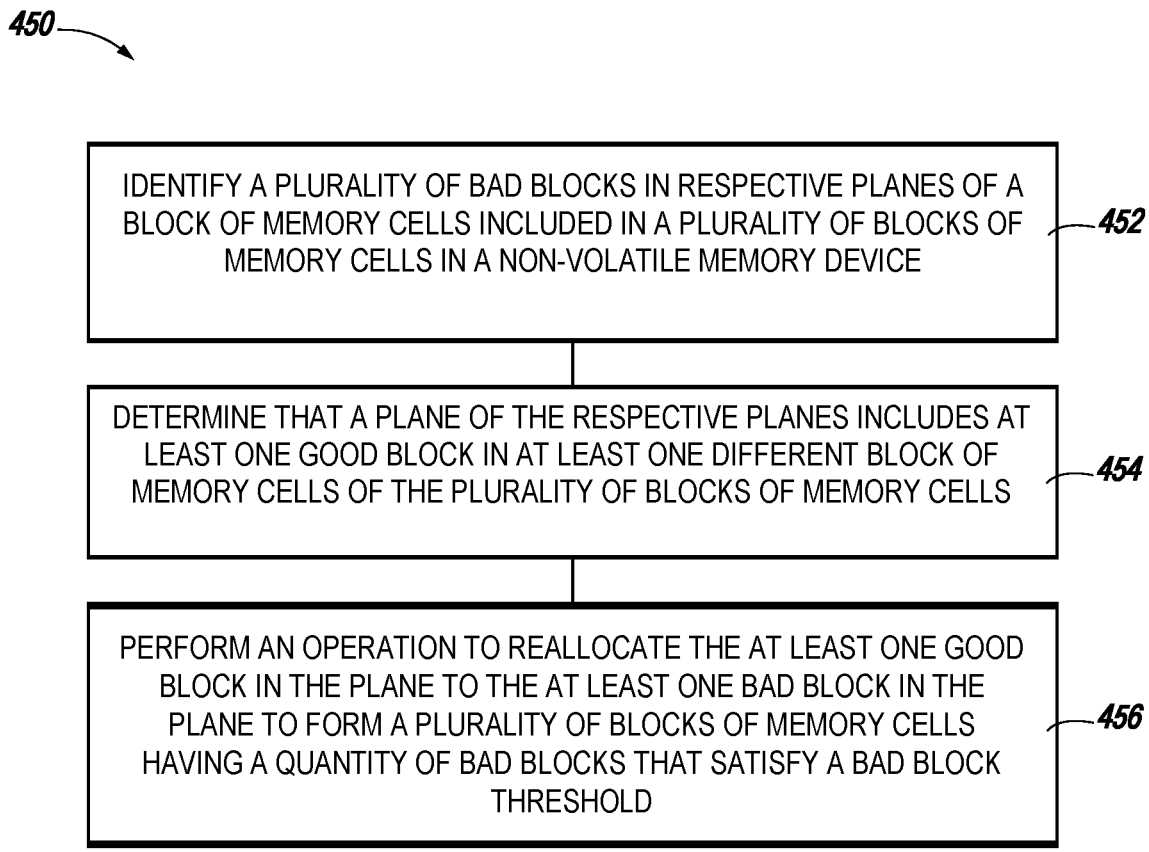
FIG. 4 illustrates an example method for partial superblock memory management in accordance with embodiments of the present disclosure.

FIG. 4 is a flow diagram corresponding to a method 450 for partial superblock memory management in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the partial superblock memory management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, a quantity of bad blocks in respective planes of a block of non-volatile memory cells (e.g., NAND memory cells) can be identified. For instance, bad blocks in respective planes of a block of non-volatile memory cells included in a plurality of blocks of non-volatile memory cells in a non-volatile memory device can be identified. In some embodiments, the particular number of bad blocks can be determined at a beginning of usage of the memory system by a user, subsequent to manufacturing testing, at a particular life cycle in the usage of the memory system, etc. For instance, the quantity of bad blocks can be identified prior to native use, or use by a user. As an example, the quantity of bad blocks can be identified during a testing and/or manufacturing phase of the memory sub-system.

At operation 454, a plane of the respective planes can be determined to include at least one good block in at least one different block of non-volatile memory cells of the plurality of blocks of non-volatile memory cells. At operation 456, at least one good block in the plane can be reallocated to the at least one bad block in the same plane to form respective blocks of non-volatile memory cells (e.g., partial superblocks) having a quantity of bad blocks that satisfies a bad block threshold. In some embodiments, each of the blocks of non-volatile memory cells with the quantity of bad blocks that satisfy the bad block threshold have the same quantity of bad blocks (e.g., each having one, two, or three bad blocks, among other possible quantities of bad blocks).

In some embodiments, host data can be written to the blocks of non-volatile memory cells having the quantity of bad blocks that satisfies (e.g., is less than or equal) to the bad block threshold. In one example, writing the host data to the blocks of non-volatile memory cells having the quantity of bad blocks that satisfies the bad block threshold (e.g., partial superblocks) can include writing the host data to good blocks of the blocks of non-volatile memory cells and refraining from writing the host data to the quantity of bad blocks of the blocks of non-volatile memory cells.

Figure 5:
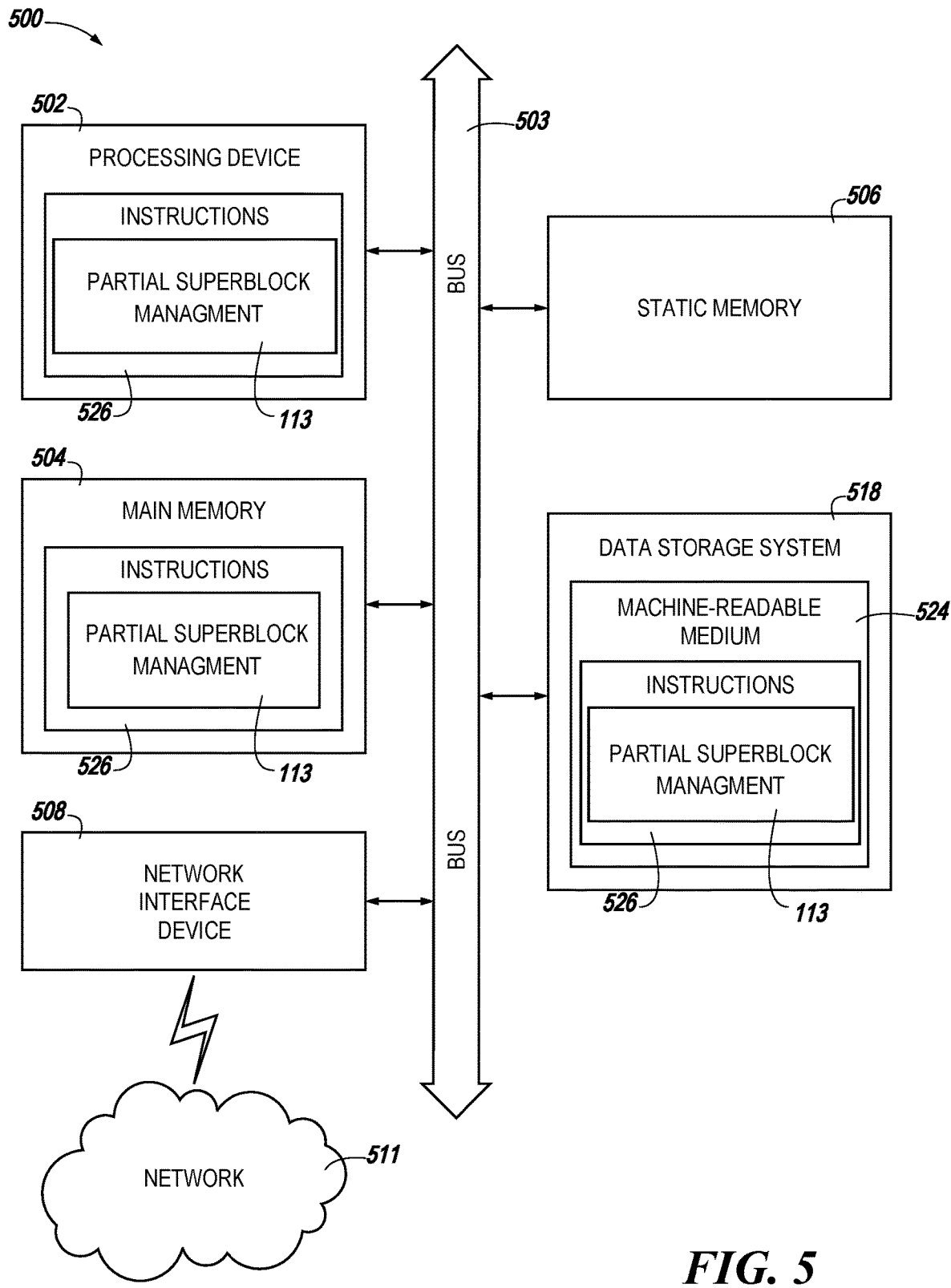
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the partial superblock memory management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 503.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 511.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a partial superblock memory management component (e.g., the partial superblock memory management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    identifying bad blocks in respective planes of a block of non-volatile memory cells of a plurality of blocks of NAND memory cells in a non-volatile memory device;
    determining that a plane of the respective planes includes at least one good block in at least one different block of non-volatile memory cells of the plurality of blocks of non-volatile memory cells; and
    performing an operation to reallocate the at least one good block in the plane to at least one bad block of the bad blocks in the plane to form a plurality of partial superblocks of non-volatile memory cells each of the partial superblocks having a quantity of bad blocks that satisfies a bad block threshold, wherein the bad block threshold is determined based on a permissible amount of latency that is based on a quantity of permissible bad blocks, in a partial superblock, divided by a quantity of the respective planes of the partial superblock.

2. The method of claim 1, wherein each of the plurality of partial superblocks having the quantity of bad blocks that is less than or equal to the bad block threshold have the same quantity of bad blocks.

3. The method of claim 2, wherein the bad block threshold is equal to three or fewer bad blocks.

4. The method of claim 2, wherein the bad block threshold is equal to one bad block.

5. The method of claim 1, wherein performing the operation to reallocate the at least one good block in the plane to reallocate the at least one bad block further comprises updating a mapping of the at least one good block, updating a mapping of the at least one bad block, or both.

6. The method of claim 1, wherein the bad block threshold scales based on a change in the permissible amount of latency, and wherein the bad block threshold increases as a permissible amount of latency increases.

7. An apparatus, comprising:
    a partial superblock memory management component configured to:
        determine a respective quantity of bad blocks of a block of non-volatile memory cells in a non-volatile memory array is greater than a bad block threshold, wherein the bad block threshold is based on a permissible amount of latency that is based on a quantity of permissible bad blocks, in a partial superblock, divided by a quantity of the respective planes of the partial superblock;
        perform an operation to reallocate a good block from a plane in another block of non-volatile memory cells to replace a bad block in the same plane of the block of non-volatile memory cells to form a plurality of partial superblocks of non-volatile memory cells each of the partial superblocks having a quantity of bad blocks that is less than or equal to the bad block threshold; and
        write host data to the plurality of blocks of non-volatile memory cells having the quantity of bad blocks that is less than or equal to the bad block threshold.

8. The apparatus of claim 7, wherein each of the partial superblocks having the quantity of bad blocks that is less than or equal to the bad block threshold is a partial superblock that is deployed across a plurality of memory dies having a plurality of planes and a plurality of pages.

9. The apparatus of claim 8, wherein the plurality of memory dies include four or fewer memory dies.

10. The apparatus of claim 8, wherein the plurality of memory dies include two memory dies.

11. The apparatus of claim 7, wherein the non-volatile memory array is resident on a mobile computing device.

12. A system, comprising:
    a memory sub-system comprising a plurality of memory dies arranged to form a stackable cross-gridded array of a plurality of superblocks of interleaved non-volatile memory cells; and
    a processing device coupled to the plurality of memory dies, the processing device to perform operations comprising:
        identifying a respective quantity of bad blocks in a partial superblock of the plurality of superblocks;
        determining the respective quantity of bad blocks satisfies a bad block threshold;
        performing an operation to reallocate a good block from a plane in another superblock of the plurality of superblocks to replace a bad block in the same plane of the partial superblock to form a plurality of partial superblocks each of the partial superblocks of the plurality of superblocks having a quantity of bad blocks that is the same and is less than or equal to the bad block threshold, wherein the bad block threshold is based on a permissible amount of latency that is based on a quantity of permissible bad blocks, in a partial superblock, divided by a quantity of the respective planes of the partial superblock; and
        writing host data to the plurality of partial superblocks having the quantity of bad blocks that is less than or equal to the bad block threshold.

13. The system of claim 12, wherein the processing device is to perform operations further comprising determining a respective quantity of bad blocks of a superblock is less than or equal to a bad block threshold.

14. The system of claim 13, wherein the processing device is to perform operations further comprising writing host data to the superblock, in response to the quantity of bad blocks of the superblock is less than or equal to the bad block threshold.

15. The system of claim 14, wherein the processing device is to perform operations further comprising performing an operation to reallocate the good block from a plane in a full superblock.

16. The system of claim 12, wherein the processing device is to perform operations further comprising determining the plurality of superblocks include a full superblock.

17. The system of claim 16, wherein the processing device is to perform operations further comprising performing the operation to reallocate the good block from the plane in the full superblock in the absence of reallocating a good block from a partial superblock.

18. The system of claim 12, wherein the processing device is to perform operations further comprising:

determining a respective quantity of bad blocks of a superblock is two more blocks greater than the bad block threshold; and performing an operation to reallocate a plurality of good block from full superblocks to replace the two or more bad blocks to form a plurality of partial superblocks each having a quantity of bad blocks that is less than or equal to the bad block threshold.

19. The system of claim 12, wherein the bad block threshold is proportional to a quantity of dies in the memory device, and wherein the bad block threshold is higher for a greater number of dies included in the memory device.

20. The system of claim 19, wherein:

the plurality of memory dies include two memory dies, and wherein the bad block threshold is equal to a first bad block threshold; or wherein the plurality of memory dies include four memory dies, and wherein the bad block threshold is equal to a second bad block threshold that is higher than the first bad block threshold.

\* \* \* \* \*